United States Patent [19]

Leibovitz et al.

[11] Patent Number: 5,055,425
[45] Date of Patent: Oct. 8, 1991

[54] STACKED SOLID VIA FORMATION IN INTEGRATED CIRCUIT SYSTEMS

[75] Inventors: Jacques Leibovitz, San Jose; Maria L. Cobarruviaz, Cupertino; Kenneth D. Scholz, Palo Alto; Clinton C. Chao, Redwood City, all of Calif.

[73] Assignee: Hewlett-Packard Company, Palo Alto, Calif.

[21] Appl. No.: 360,828

[22] Filed: Jun. 1, 1989

[51] Int. Cl.[5] .................. H01L 21/283; H01L 21/312
[52] U.S. Cl. .................................... 437/195; 437/189; 437/203; 437/228; 437/208; 437/246; 437/915; 437/978; 156/643; 156/645; 156/650; 148/DIG. 164
[58] Field of Search .............. 437/195, 228, 235, 245, 437/246, 203, 189, 915, 978, 208; 156/643, 644, 645, 650; 148/DIG. 164

[56] References Cited

U.S. PATENT DOCUMENTS

| | | | |
|---|---|---|---|
| 4,067,104 | 1/1978 | Tracy | 437/246 |
| 4,523,372 | 6/1985 | Balda et al. | 437/195 |
| 4,612,083 | 9/1986 | Yasumoto et al. | 437/246 |
| 4,710,398 | 12/1987 | Homma et al. | 437/235 |
| 4,721,689 | 1/1988 | Chaloux, Jr. et al. | 437/228 |
| 4,829,018 | 5/1989 | Wahlstrom | 437/208 |
| 4,840,923 | 6/1989 | Flagello et al. | 437/195 |
| 4,879,257 | 11/1989 | Patrick | 437/228 |

Primary Examiner—Brian E. Hearn
Assistant Examiner—Tuan Nguyen

[57] ABSTRACT

A method of forming solid copper vias in a dielectric layer permits stacked up vias in a multi-layer multi-chip carrier. An conducting layer is deposited over a substrate and lines of a first interconnect layer formed on the substrate. An aperture formed in a photoresist layer over said lines is filled with copper by electroplating to form a solid via. The via can be polished until its top is flat. Using a photoresist mask, the conductive layer used for electroplating is removed between the lines. A dielectric layer is then formed over the lines and via. A bulge in the dielectric over the via is removed by etching through an aperture defined in a photoresist layer, which is then stripped. A second interconnect layer can be formed on the resulting structure. The foregoing steps can be iterated to build a multi-layer structure with stacked up vias.

8 Claims, 6 Drawing Sheets

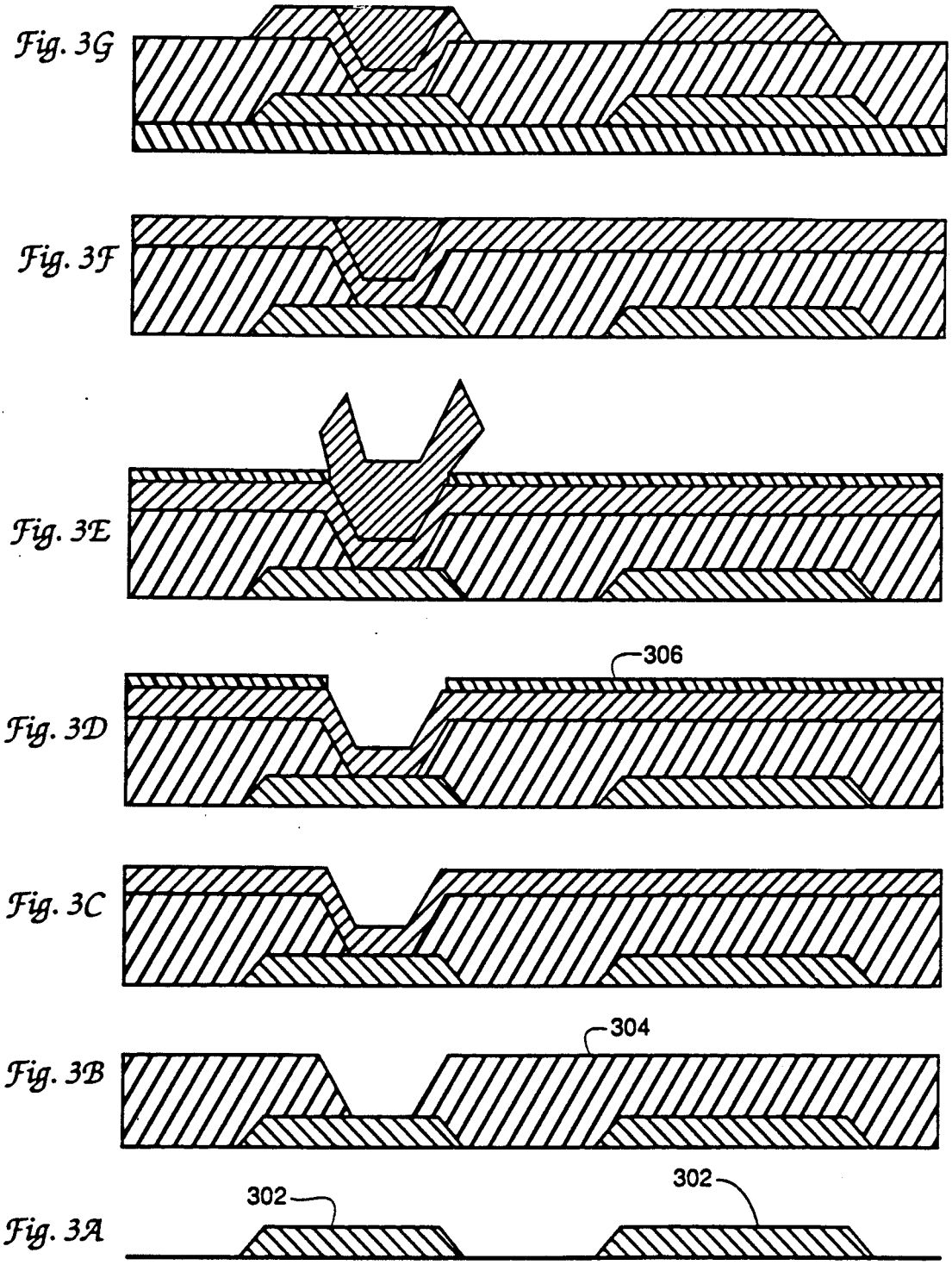

STACKED SOLID VIA FORMATION IN INTEGRATED CIRCUIT SYSTEMS

BACKGROUND OF THE INVENTION

The present invention relates to integrated circuits and, more particularly, to a method of forming stacked solid vias and to structures resulting from the method. A major objective of the present invention is to provide for high density multi-chip carriers.

Much of recent technological progress is identified with the increasing miniaturization afforded by advances in integrated circuit processing technology. Dramatic improvements in the circuit density available on individual integrated circuit chips have been made. Integration of these integrated circuit chips typically requires that the chips be individually packaged and the packages mounted on printed circuit boards. The size of the packages limits the chips' density on the printed circuit board. This lack of chip density requires larger systems and limits performance due to longer connections.

More recently, multi-chip carriers have been developed which permit integrated circuit chips to be mounted on a common carrier without the need for packaging the individual chips. This allows the chips to be packed more closely together.

While multi-chip carriers have been fabricated using a variety of technologies, the greatest chip density has been achieved by multi-chip carriers fabricated using integrated circuit processing technology. In other words, a multi-chip carrier can be fabricated by photolithographically defining multiple layers of circuits interconnected by metallic vias through intermediate dielectric layers.

The vias can be formed as follows. Apertures are photolithographically defined in a dielectric layer deposited over a lower circuit layer. Vias are then formed in these apertures by sputtering or by chemical vapor deposition. Copper is the preferred via material because of its higher conductivity and current-carrying capacity but requires a distinct adhesive layer, e.g., of chromium to bond the copper to the dielectric; aluminum bonds effectively with dielectrics and for this reason is sometimes used.

The vias formed by the sputtering or chemical vapor deposition into a defined aperture are hollow. Hollow vias cannot be stacked up through successive layers because of attendant photolithographic difficulties. Specifically, a photoresist layer will follow the curvature of a hollow via surface. The resulting curvature causes deviations in the light beam used to define patterns in the photoresist; these deviations prevent certain regions of the photoresist from being exposed, and conversely, expose other regions that must not be exposed, so that the desired pattern cannot be formed.

Where interconnections are required through successive layers, the vias through individual layers are offset, forming a set of steps requiring extra space. This limits the circuit density of the carrier and thus the density with which chips can be arranged on the carrier. In addition, the less dense arrangement requires longer signal paths, which are characterized higher impedance and longer signal travel time.

What is needed is a method of fabricating a multi-chip carrier that provides for greater density in the arrangement of the integrated circuit chip carrier. More specifically, what is needed is a method of fabricating stacked vias compatible with integrated circuit processing technology.

SUMMARY OF THE INVENTION

In accordance with the present invention, a method provides for the formation of solid vias which can be stacked. Preferably, the vias formed are of copper, however, the method also provides for the formation of vias formed of other highly conductive metals such as silver, gold and platinum.

The first step of the method is to form a circuit pattern on a substrate. This can be done using conventional photolithographic techniques. In a second step, photoresist is applied over the circuit pattern, and apertures are defined, e.g., photolithographically, through this photoresist.

In a third step, the apertures are filled by plating metal, such as copper to form solid vias. Preferably, electroplating is used, but the invention provides for electroless plating as well. Where electroplating is used, an additional step is required in which an electrically conducting layer is deposited over the circuit pattern before the photoresist is deposited. This electrically conducting layer provides a circuit path for the electroplating current used to form the vias. The preferred material for this conducting layer is copper, which however does not effectively bond to dielectrics, i.e., the material exposed through the circuit pattern or the dielectric material to be deposited subsequently. Accordingly, metal adhesive layers, e.g., of chromium, can be deposited before and after a copper electrically conductive layer to ensure proper bonding with adjacent dielectric materials.

Generally, the electroplating process does not result in flush vias. Accordingly, polishing can remove surface irregularities to prepare the surface for subsequent processing.

In a fourth step, a dielectric layer is deposited. In a fifth step, a photoresist is applied over the dielectric layer. Apertures are defined through the photoresist to expose regions of the dielectric layer overlaying the vias. In a sixth step, the exposed dielectric is etched to expose the vias to permit electrical contact with subsequently formed lines and vias.

A second electrical circuit layer can be formed above the structure resulting from the above-described procedure. This second circuit layer can include circuit layer lines and second circuit layer vias. These second circuit layer vias are stacked on some of the first dielectric layer. A second dielectric layer including vias stacked over vias and lines of the first circuit layer can be fabricated in the manner of the first dielectric layer. Subsequent circuit and dielectric layers can be similarly fabricated, resulting in a multilayer structure with vertical interconnects through several layers.

Since multilayer interconnects can be formed with stacked solid vias, rather than relying on offset hollow vias, greater circuit density can be achieved in a multi-chip carrier. Moreover, since stacked vias minimizes interconnect lengths, impedance and signal travel time are minimized. Furthermore, the stacked vias provide for more effective heat transfer from the mounted integrated circuit chips. Because of the heat transfer characteristics of stack vias, they can be used as "studs" for heat removal even where they are not required for electrical interconnection. These and other features and advantages of the present invention are apparent from

BRIEF DESCRIPTION OF THE DRAWINGS

FIG. 3 illustrates the cross section of the product at successive steps of the process in accordance with an alternative method of fabricating solid copper vias.

DESCRIPTION OF THE PREFERRED EMBODIMENTS

Figure 1G:
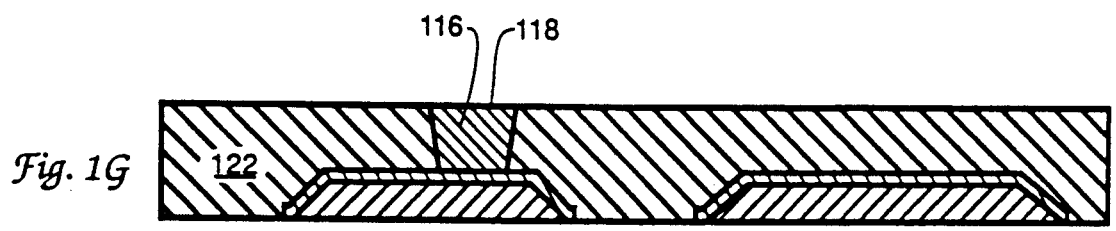
FIGS. 1A–1G represent stages in the fabrication of a structure including a solid copper via in accordance with the present invention.
Figure 1F:
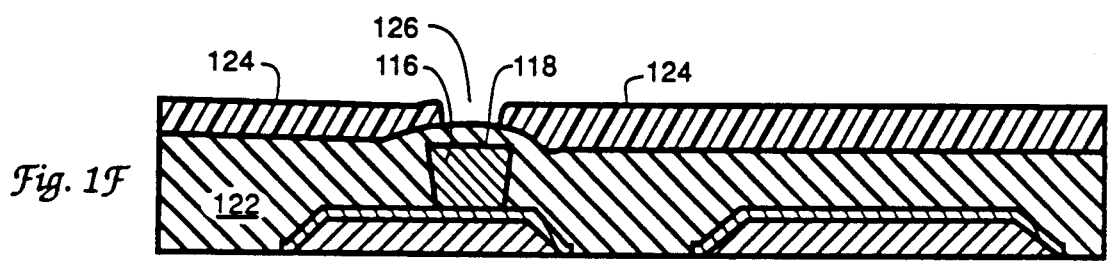
Figure 1E:
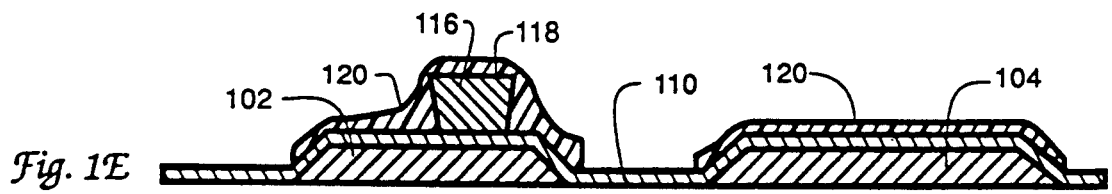
Figure 1D:
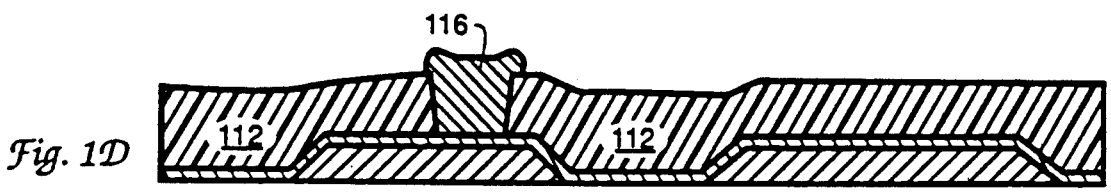
Figure 1C:
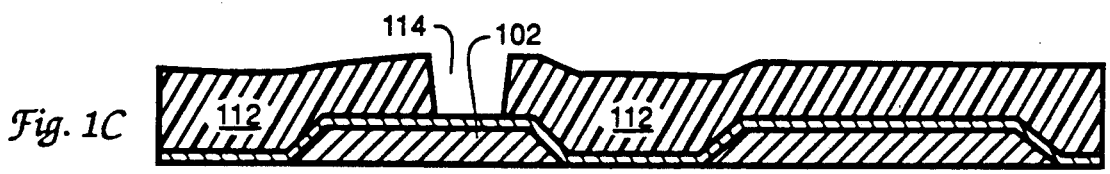
Figure 1B:
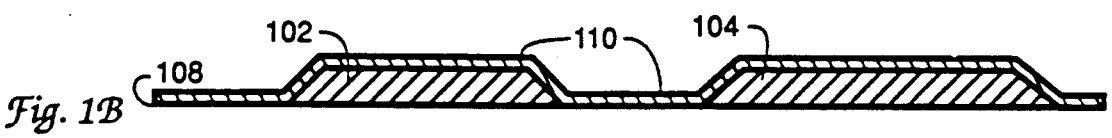
Figure 1A:
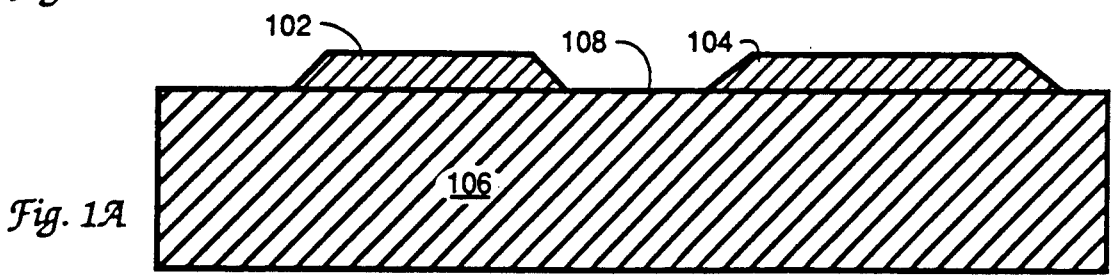

In accordance with the present invention, a method for forming solid copper vias which can be stacked is illustrated in FIGS. 1A–1G. FIG. 1A represents a starting point for the present invention and shows copper lines 102 and 104 formed on a silicon substrate 106, the upper surface 108 of which had been oxidized to silica. As is known in the art, a thin chromium layer can be used to bond copper lines 102 and 104 to surface 108.

A thin composite layer 110 is deposited over the structure of FIG. 1A, resulting in the structure of FIG. 1B. Composite layer 110 comprises a copper center sandwiched between chromium adhesion layers. Composite layer 110 will serve to conduct electricity for a subsequent electroplating step. A photoresist layer 112 is deposited over the structure of FIG. 1B and an aperture 114 is formed through photoresist layer 112 and over line 102 to define the location for a via to be formed subsequently, resulting in the structure of FIG. 1C.

Aperture 114 is filled with copper to form solid via 116 in an electroplating step, resulting in the structure of FIG. 1D. A polishing step removes excess copper so that the via top 118 is planar (as indicated in FIG. 1E). Photoresist layer 112 is removed. A new layer of photoresist 120 is deposited and patterned to form a protective mask over lines 102 and 104 and via 116, as shown in FIG. 1E. The exposed portions of composite layer 110 are etched (as indicated in FIG. 1F).

Photoresist 120 is stripped and a polyimide layer 122 is formed over the remaining structure. Another photoresist layer 124 is deposited over polyimide layer 122. An aperture 126 is defined through photoresist layer 124 over via 116, resulting in the structure of FIG. 1F. The exposed polyimide is etched away using a reactive ion etch. This exposes the top of the via for subsequent connection and the photoresist remaining after the reactive ion etch is removed, resulting in the structure of FIG. 1G.

The structure of FIG. 1G then becomes the substrate for the next iteration of the procedure. A second layer interconnect pattern is constructed on the top surface of the new substrate surface. The second layer interconnect pattern can include both lines and vias formed concurrently with the lines. Some of the vias formed in the first iteration will connect to lines in this second layer interconnect pattern; other vias in the first dielectric layer will require electrical contact with more distant lines through intermediate and stacked up vias in a second and subsequent dielectric layers. A second dielectric layer with vias therethrough can be formed using a second iteration of the process described with reference to FIGS. 1B–1G. After several iterations, the resulting structure will comprise alternation interconnect and dielectric layers, both of which can include vias. The vias in the dielectric layers are formed as detailed above, while the vias in the interconnect layers are formed as the interconnects are defined.

Figure 2:
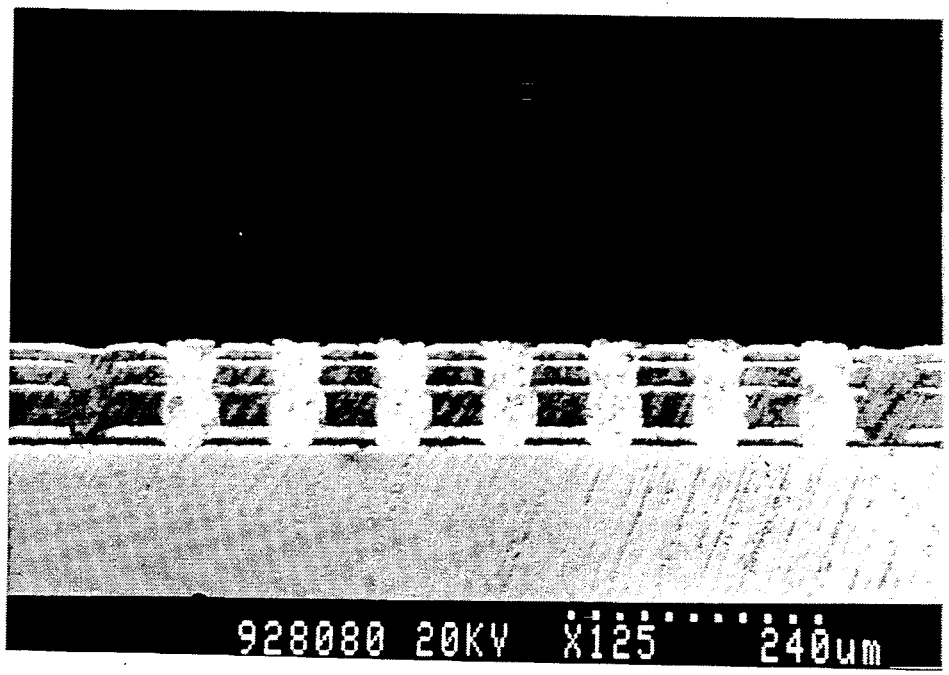
FIG. 2 is a microscope picture of the cross section of four levels of stacked up solid copper vias, 40 micrometers in diameter, in a Polyimide/Copper structure of five metal layers, in accordance with the invention, fabricated.

FIG. 2 shows a microscope picture of the cross section of four levels of stacked up solid copper, 40 micrometers in diameter, in a Polyimide/Copper structure of five metal layers. The dielectric layers are, from the bottom, 10, 40, 20 and 15 micrometers thick, respectively.

In accordance with the invention, stacked up fine solid copper vias and heat conducting studs in Polyimide/Copper structures for high performance MCMs can be fabricated by an alternative method as described in the following.

In accordance with the method, the solid copper for vias or studs first are made in the regular shape of cups, then are filled and overfilled with copper and, finally, are polished back to the required level. The relevant steps of the process are given below. The cross sections of the product corresponding to the successive steps are illustrated in FIG. 3.

Consider the nth metal layer 302 of a Polyimide/Copper structure (FIG. 3A). The next layer and the cup shape vias connecting between these two layers usually are formed by first fabricating a cured polyimide layer 304 with the via apertures (FIG. 3B), and then depositing a Cr/Cu/Cr metalization (FIG. 3C). The two Cr (chromium) layers are 0.05 micrometers thick and, mainly, serve adhesion needs. Finally, the metal is patterned by masking and etching leaving the (n+1)th metal layer and the cup shaped vias connecting to the nth layer.

The filling up of the copper cups is executed before the patterning of the (n+1)th metal layer, i.e., starting with the situation represented in FIG. 3C, and proceeds as follows:

A. Mask with PR (photoresist) 306 {i.e., spin, dry, expose, develop, hard bake)} such as to expose the copper cups (FIG. 3D).

B. Etch top Cr layer exposed in previous step,

C. Electroplate Cu (copper) to fill up the cups. Note the resulting overfill FIG. 3E).

D. Polish and strip remaining PR (FIG. 3F).

E. When needed, 0.05 micrometer of Cr may be deposited to cover the copper top.

Then, the Cr/Cu/Cr metalization is patterned to complete the (n+1)th metal layer (FIG. 3G).

Each following layer of metal, vias and studs is fabricated similarly.

Figure 4A:
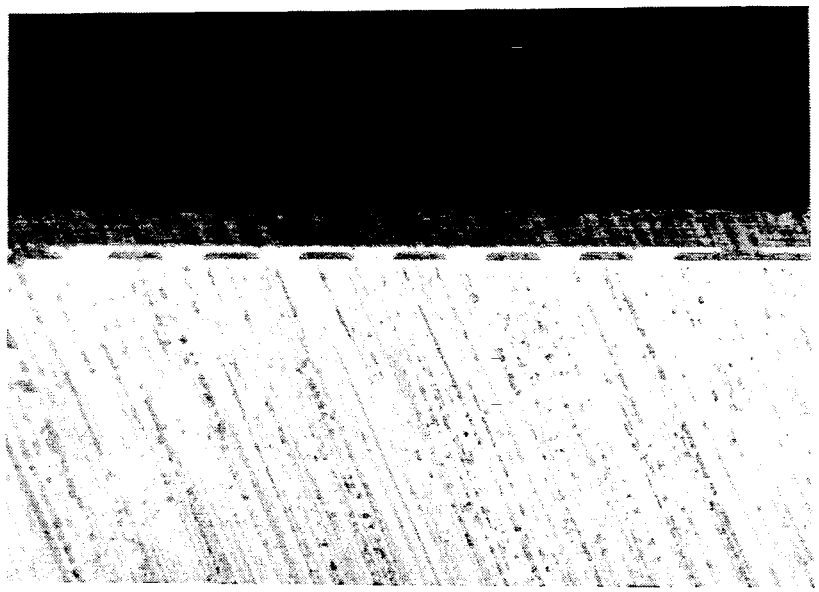
FIG. 4 are microscope pictures of the cross section of solid copper vias, 40 micrometers in diameter, 10 micrometers tall built in a Polyimide/Copper structure in accordance with alternative method.
Figure 4B:
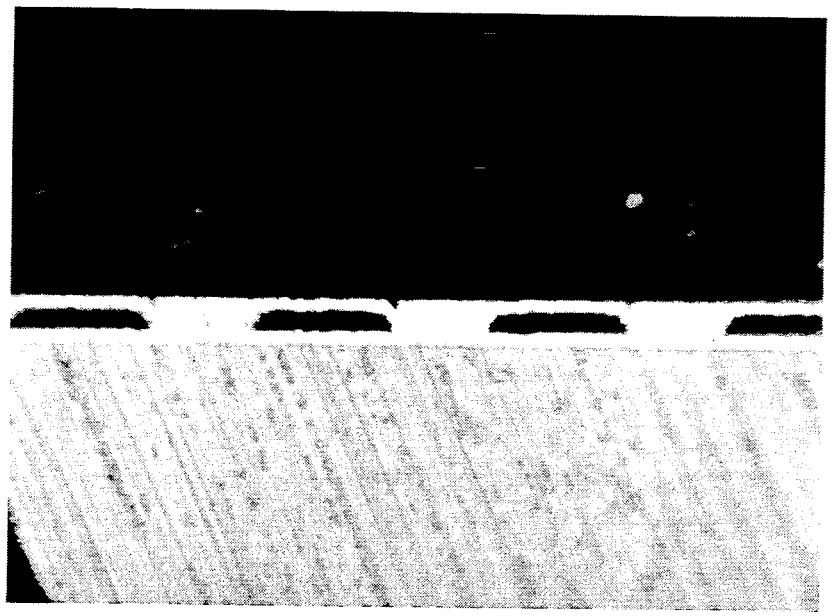
Figure 5A:
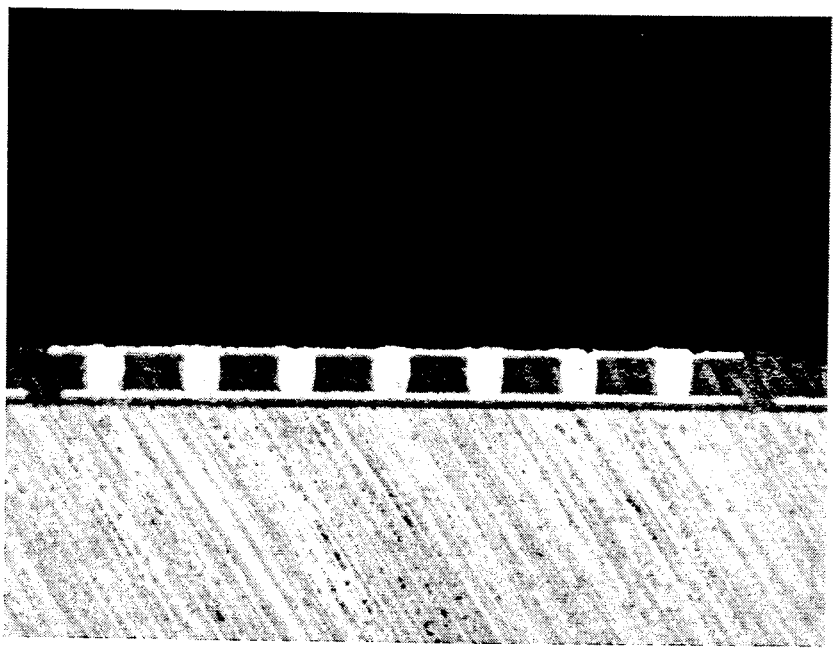
FIG. 5 are microscope pictures of the cross section of solid copper vias, 40 micrometers in diameter, 40 micrometers tall built in a Polyi-mide/Copper structure and using polishing.
Figure 5B:
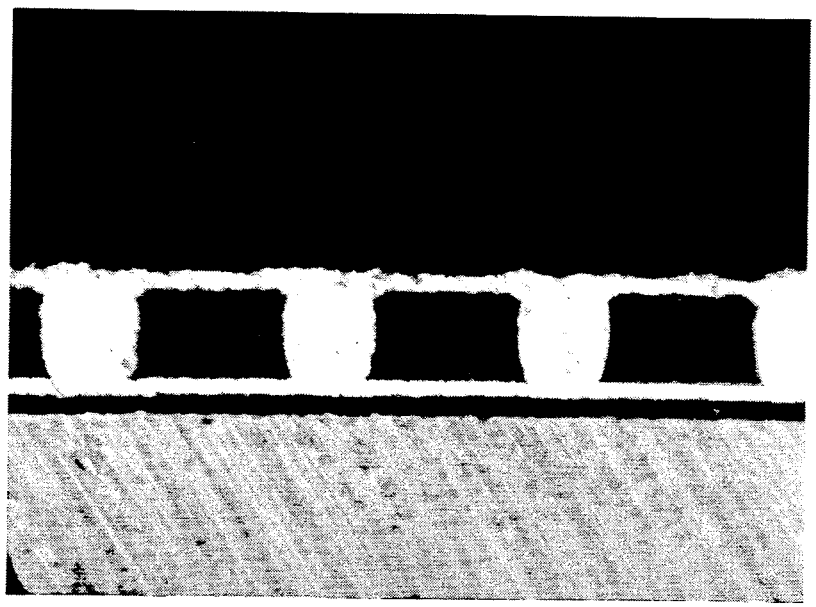

FIGS. 4 and 5 show cross section pictures of solid copper vias, 40 micrometers in diameter, built in a Polyimide/Copper structure by the described alternative method.

In accordance with the invention, the fine solid copper for vias and studs are formed first, and the polyimide is formed afterwards. The corresponding steps of the process are given below. The cross sections of the product corresponding to the successive steps are illustrated in FIG. 1A–G. The first metal layer 102–104 can be formed over substrate 106 by first depositing a Cr/Cu/Cr metalization (FIG. 1A), then patterning it by masking with PR (photoresist), selective etching of the successive metals and stripping the PR. The two Cr layers are 0.05 micrometers thick and, mainly, serve adhesion needs.

In accordance with the invention, the Cr/Cu/Cr metalization for the first metal layer is formed as described above except that the fine solid copper vias and studs are formed before the bottom Cr layer is etched.

The processing then proceeds as follows:

A. Deposit a Cu/Cr metalization 0.2 to 1.0 micrometer thick (FIG. 1B). This metalization serves to conduct the electrical current during the subsequent elecroplating step. The Cr layer is 0.05 micrometers thick and, mainly, serves adhesion needs.

B. Mask with PR (photoresist) {i.e., spin, dry, expose, develop, hard bake)}, such as to expose the metalization where the copper vias or studs are to be built. The thickness of the PR should equal the height of copper build up, FIG. 1C.

C. Electroplate Cu (copper) to fill up the apertures in the PR. Note the resulting overfill, FIG. 1D.

D. Polish, strip PR and mask the copper lines, vias and studs with new PR, FIG. 1E.

E. Strip the thin metalization layer which served to conduct the electroplating current in preceding step (C), and strip the PR.

F. Build the polyimide layer. Two procedures have been used.

1. One consists of the following:
a. Dry bake.
b. Plasma clean.
c. Spin polyimide precursor solution, and spin dry.
d. Soft bake (obtain B-phase).
e. Mask with PR (open atop vias and studs), FIG. 1F.
f. Etch the polyimide bulge atop vias and studs.
g. Strip the PR.
h. Cure the polyimide, FIG. 1G.

2. The other procedure consists of the following:
a. Dry bake.
b. Plasma clean.
c. Spin polyimide precursor solution, and spin dry.
d. Soft Bake.
e. Cure.
f. Mask with thick PR, opening atop vias and studs, FIG. 1F.
g. Dry etch (RIE) the polyimide bulge atop vias and studs.
h. Strip the PR, FIG. 1G.

Each following layer of metal and vias (and studs) is fabricated similarly. The stacked up vias shown in FIG. 2 were fabricated according to the above procedure.

Figure 6:
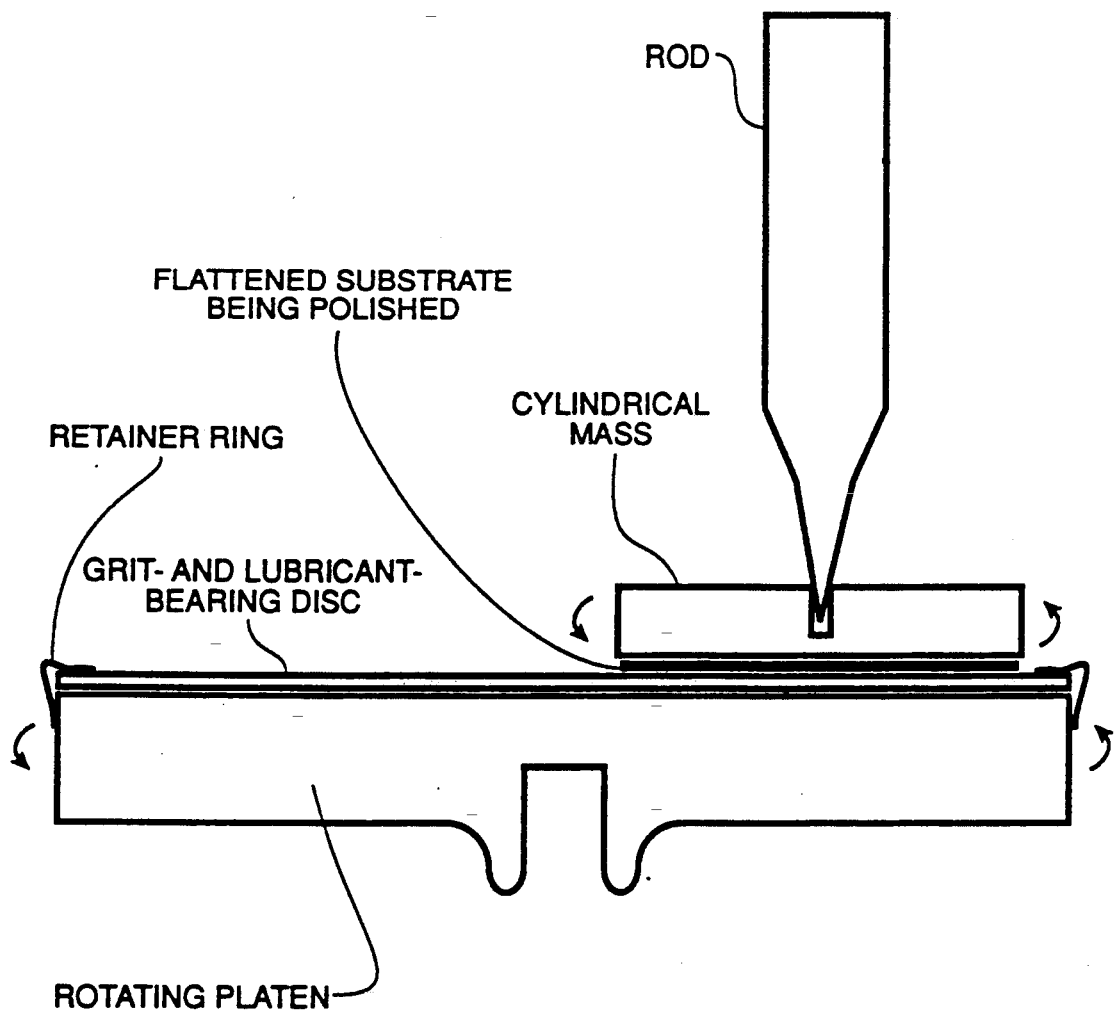
FIG. 6 illustrates the polishing of substrate surfaces with a very high degree of orientation accuracy, using metalographic or wafer polishing equipment, and a substrate holder designed with three degrees of angular freedom which forces the substrate surface to automatically align to the polishing platen surface, in accordance with the invention.

In accordance with the invention, a method, tooling and procedure are provided to maintain the substrate during the mechanical polishing operation at a slope smaller than 1/100,00 relative to the polishing platen. The substrate holder is designed with three degrees of angular freedom thus forcing the substrate to automatically self align to the rotating polishing platen surface. The tooling and procedures are described in the following:

A: Equipment and Tooling:

1. A rotating polisher (Polmet from Buehler, as an example).
2. Platens and discs bearing the requisite polishing grits.
3. A substrate holder with three degrees of angular freedom. There are many ways to design for three degrees of angular freedom. In one embodiment, the holder is as follows:

a. A cylindrical mass machined (from brass, as an example) to a diameter somewhat larger (0.5", as an example) than that of the substrate. Also, the cylinder has an axial hole (0.17 inch, as an example), preferably not through both end surfaces, FIG. 6.
b. A rod with a tapered end such that when it is inserted in the cylinder hole until it intersects with the hole's rounded edge it does not reach the hole bottom.

Other examples of possible embodiments may include other designs of three angular degrees of freedom such as a ball joint, a universal joint coupled to a bearing, etc.

B. Procedures:

1. The back of the substrate is waxed flat against the cylinder end surface without the hole.
2. The polishing platen rotation speed control is set to zero.
3. The substrate/cylinder assembly is placed face down on the platen, off center, FIG. 7. The platens are used in graded sequence from the coarse to the fine polishing grit, with the customary cleaning procedures at each platen change to avoid cross contamination.
4. The rod's tapered end is inserted into the hole.
5. Holding the rod nearly vertically, and using it to control the position of the substrate surface on the platen, gradually the platen rotating speed control is increased from zero to the desired speed. The larger linear speed with distance from the platen center causes the substrate to rotate thus distributing the polishing action uniformly over its surface.
6. After the desired polishing time, the platen rotating speed control gradually is decreased to zero. The assembly is removed, rinsed, dried and examined.
7. Based on the examination, more polishing is carried out at the same grit grade (steps 3–6) or the sample is thoroughly cleaned in an ultrasonic bath, the platen changed to the next grade, and polishing resumed (steps 3 through 6), and so on until polishing is completed.

The solid copper vias shown in FIG. 5 were fabricated in accordance with this invention. The above described polishing requires starting material initially planarized. The requirement is relaxed by use of padded platen surfaces (carrying the polishing grit).

In accordance with the invention, a mechanical polishing method, tooling and procedures are provided to inherently maintain the substrate during the polishing operation at a slope smaller than 1/100,000 relative to the polishing platen. The substrate holder is designed to "float" the substrate, face down at the desired pressure, onto a shaking polishing platen surface such that the substrate surface inherently self aligns to the shaking polishing platen surface. The tooling and procedures are described below.

A. Equipment and Tooling:

1. A shaking polisher (from Labtone, as an example).

2. Polisher wells with the requisite polishing grade grits.

3. A hard flat surface (flat glass, as an example), fitting the bottom of each polisher well.

4. A substrate holder described as a cylindrical mass machined (from brass, as an example) to a diameter somewhat larger (0.5", as an example) than the substrate. The density and height of the holder determines the polishing pressure.

B. Procedures:

1. The back of the substrate is waxed flat against a cylinder end surface.

2. The polisher is switched off.

3. the substrate/cylinder assembly is placed face down on the platen. Several such assemblies can be placed on the plated for polishing simultaneously. The wells (and hard flat surfaces) are used in graded sequence from the coarse to the fine polishing grip, with the customary cleaning procedures at each change to avoid cross contamination.

4. The polisher is switched on. After the desired polishing time, the polisher is switched off. The assembly is removed, rinsed, dried and examined.

5. Based on the examination, more polishing is carried out at the same grit grade (steps 3,4) or the sample is thoroughly cleaned in ultrasonic bath, the well and platen changed to the next grade, and polishing resumed (steps 3,4), and so on until polishing is completed.

The solid copper vias of FIG. 4 were fabricated in accordance with this procedure. This procedure requires starting material which is initially planarized. This requirement can be relaxed by use of padded platen surfaces (carrying the polishing grit).

In accordance with the invention, a method, tooling and procedures are provided for polishing the copper, above the substrate surface, without the imposition of the stringent requirements on orientation inherent to the mechanical polishing methods.

A. Tooling:

1. An acid resistant plate (of polypropylene, as an example).

2. Lintless pieces of cloth soaked with graded strengths cop-per etchant (Transene CE-200, as an example).

3. A substrate holder (a hand held vacuum chuck, as an example).

B. Procedures (Caution: Wear adequate protective gloves and gear):

1. The soaked cloth is flattened against the plate surface.

2. The substrate is held by its back onto the vacuum chuck.

3. The substrate/chuck assembly is placed with the substrate face down on the flattened cloth, and moved about thus continuously wiping the substrate surface against the soaked cloth. The soaked cloths are used in graded sequence from the stronger to the weaker etchant strength.

4. After the desired polishing time, the assembly is removed and immediately rinsed and dried, and then examined.

5. Based on the examination, more polishing is carried out at the same etchant strength (steps 3, 4) or the soaked cloth is changed to the next etchant strength, and polishing resumed (steps 3, 4) and so on until polishing is completed.

The solid copper vias shown in FIG. 2 were fabricated in accordance with this procedure.

The present invention can be applied in the fabrication of integrated circuit chips as well as in the fabrication of multi-chip carriers. As is apparent to those skilled in the art, many modifications to the disclosed embodiment can be made while retaining the essential features of the invention.

The present invention provides for substrates other than silicon, e.g., a metal, a metal with a dielectric layer, or a flexible substrate such as a polyimide film. The lines can be copper, silver, gold, or platinum. The conducting layer can include the same range of metals as the lines, as can the vias. The dielectric layer can be of alumina, silica, etc.

The present invention provides for the use of photosensitive dielectrics. In such a case, the photo-imagable layer used to define the via can be retained as the dielectric layer. Electroless plating can be used to form the vias. In this case, the conductive layer below the vias is not required. According, it is neither necessary to deposit this metal nor to remove the portions of it which interconnect lines.

These and other variations upon and modifications to the described embodiments are provided for by the present invention, the scope of which is limited only by the following claims.

What is claimed is:

1. A method of forming an integrated circuit structure including solid vias, said method comprising the steps of:
   a) forming a circuit pattern on a substrate;
   b) depositing a photoresist layer on the circuit pattern, and forming apertures in said photoresist layer;
   c) plating solid metal vias in the apertures and, then, removing said photoresist layer;
   d) depositing a first dielectric layer over the circuit pattern and the solid metal vias;
   e) defining apertures in the first dielectric layer over the solid metal vias; and
   f) etching the apertures in the first dielectric layer to expose surfaces of the solid metal vias.

2. The method of claim 1 wherein step b further includes depositing an electrically conductive layer over the circuit pattern and said substrate prior to the deposition of said photoresist layer.

3. The method of claim 2 wherein said electrically conductive layer comprises a copper layer sandwiched between metal adhesive layers.

4. The method of claim 3 further comprising the steps of forming a second circuit pattern, including second circuit layer lines and second circuit layer vias, on the structure resulting from step f with some of the vias in the second circuit layer vias being stacked on some of the vias in the first dielectric layer.

5. The method of claim 4 further comprising repeating steps b through f to form a second dielectric layer over said second circuit pattern.

6. The method of claim 5 wherein selected ones of the solid metal vias in the second dielectric layer are interconnected with selected ones of the solid metal vias in the first circuit layer to form a multiple layer interconnect.

7. The method of claim 2 wherein the plating step comprises electroplating the vias on the first dielectric layer.

8. The method of claim 7 wherein the depositing step comprises removing portions of the electrically conductive layer prior to depositing the dielectric layer.

* * * * *